(12) United States Patent
Hattass et al.

(10) Patent No.: US 11,520,013 B2
(45) Date of Patent: Dec. 6, 2022

(54) LIDAR SYSTEM INCLUDING CONVECTION COOLING

(71) Applicant: Robert Bosch GmbH, Stuttgart (DE)

(72) Inventors: Mirko Hattass, Stuttgart (DE); Michael Zoeller, Beilstein (DE); Alexander Greiner, Reichenbach (DE); Remigius Has, Grafenau-Daetzingen (DE)

(73) Assignee: Robert Bosch GmbH, Stuttgart (DE)

( * ) Notice: Subject to any disclaimer, the term of this patent is extended or adjusted under 35 U.S.C. 154(b) by 387 days.

(21) Appl. No.: 16/646,134

(22) PCT Filed: Sep. 7, 2018

(86) PCT No.: PCT/EP2018/074164
§ 371 (c)(1),
(2) Date: Apr. 28, 2020

(87) PCT Pub. No.: WO2019/052922
PCT Pub. Date: Mar. 21, 2019

(65) Prior Publication Data
US 2020/0271759 A1  Aug. 27, 2020

(30) Foreign Application Priority Data
Sep. 14, 2017  (DE) .................. 10 2017 216 241.4

(51) Int. Cl.
*H05K 7/00* (2006.01)
*G01S 7/481* (2006.01)
*H05K 7/20* (2006.01)

(52) U.S. Cl.
CPC ............ *G01S 7/4813* (2013.01); *H05K 7/202* (2013.01)

(58) Field of Classification Search
USPC .......................... 361/714, 728, 729, 752, 796
See application file for complete search history.

(56) References Cited

U.S. PATENT DOCUMENTS

2014/0111812 A1* 4/2014 Baeg .................. G01S 17/87
356/610

FOREIGN PATENT DOCUMENTS

| DE | 102006024534 A1 | 11/2007 |
| DE | 102010032726 B3 | 11/2011 |
| DE | 102012110584 A1 | 6/2014 |
| EP | 3032278 A1 | 6/2016 |

OTHER PUBLICATIONS

International Search Report dated Dec. 14, 2018 for corresponding International Application PCT/EP2018/074164.

* cited by examiner

*Primary Examiner* — Hung S. Bui
(74) *Attorney, Agent, or Firm* — Norton Rose Fulbright US LLP; Gerard Messina

(57) ABSTRACT

A LIDAR system that includes a laser unit, a receiving unit, and a cooling device for generating a cooling airflow. The laser unit, the receiving unit, and the cooling device are situated rotatingly about a rotational axis, so that the cooling airflow for cooling the rotating components is generated by the LIDAR system itself.

8 Claims, 3 Drawing Sheets

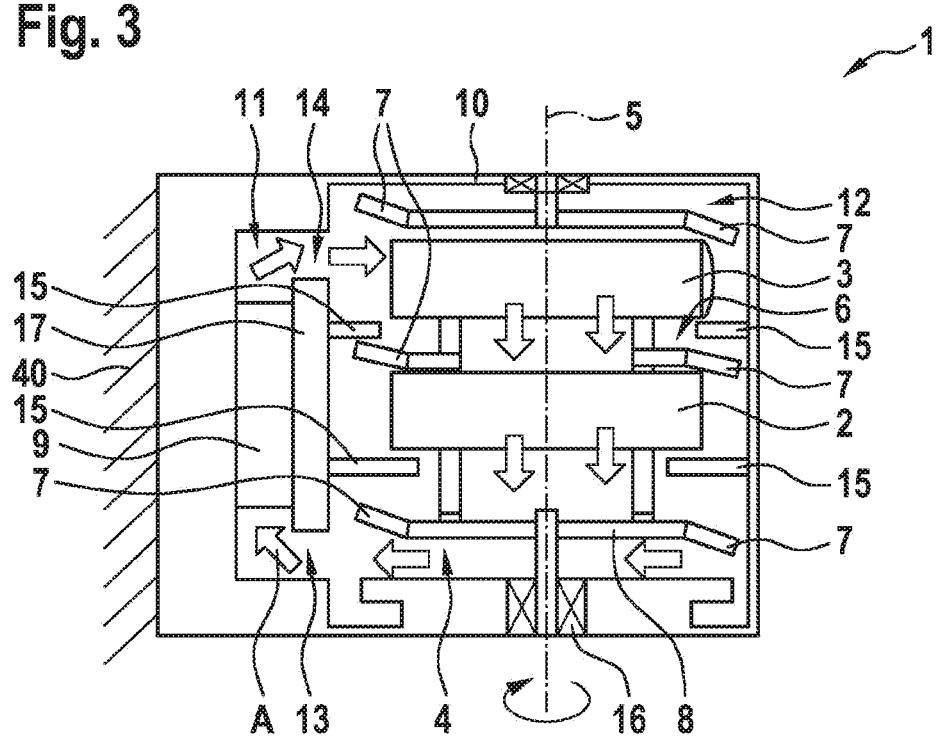
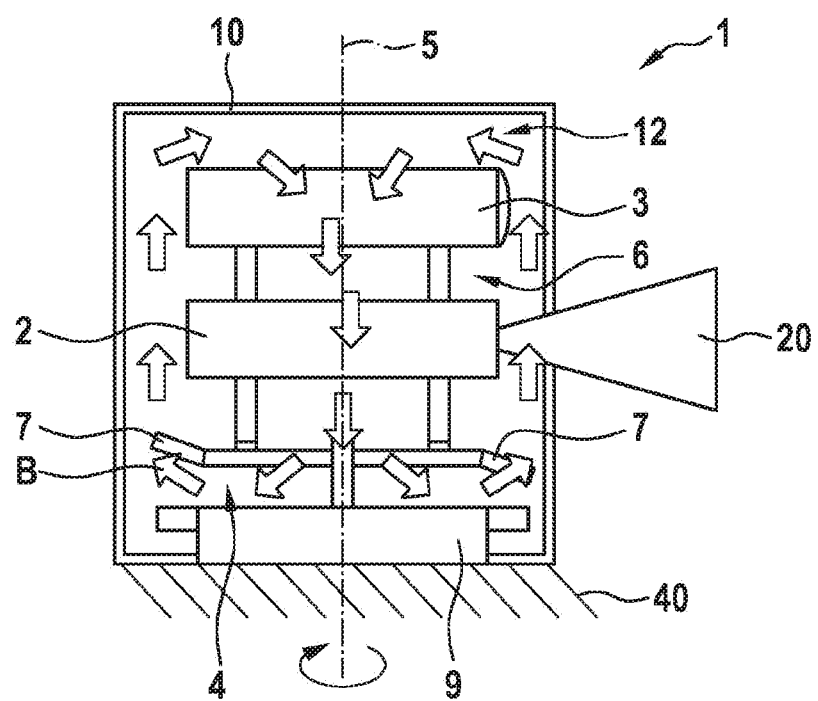

LIDAR SYSTEM INCLUDING CONVECTION COOLING

FIELD

The present invention relates to a LIDAR system. In particular, the present invention relates to a LIDAR system in which a defined cooling airflow for efficient cooling of the rotating components is generated.

BACKGROUND INFORMATION

LIDAR systems are used for surroundings detection in motor vehicles. A LIDAR system includes a laser and a receiving unit which are generally situated on a rotation element. Lasers having comparatively high optical powers, and thus likewise high thermal powers, are used in such applications. To avoid harmful effects on the components, such as malfunctions or functional restrictions, efficient dissipation of the heat from the components is necessary. This may take place passively, for example, with the aid of heat conduction to the carrier system. In addition, it is possible to use active cooling methods. Such an active cooling method is described in German Patent Application No. DE 102012110584 A1. A sensor device, such as a radar system or LIDAR system, in a vehicle is cooled by an airflow that is preferably discharged by an existing ventilation system, for example the air conditioner.

However, such an external cooling device has the disadvantage that an additional power source is necessary, thus increasing the complexity and the costs. An object underlying the present invention is to design a LIDAR system in such a way that targeted convection cooling is generated by the LIDAR system itself, thus enabling simple, cost-effective cooling of the rotating components.

SUMMARY

An example LIDAR system according to the present invention may have the advantage that, due to forced convection cooling that automatically starts during operation of the LIDAR system, i.e., when the components are rotating, and automatically stops upon shutoff, reliable and efficient cooling, and thus reliable operation of the LIDAR system, is always ensured.

This is achieved according to an example embodiment of the present invention in that a LIDAR system that includes a laser unit, a receiving unit, and a cooling device that generates a cooling airflow is provided. The laser unit, the receiving unit, and the cooling device rotate about a rotational axis. The rotational axis may be vertical, for example.

The cooling device of the LIDAR system according to the present invention may be designed and configured in different ways. The laser unit, the receiving unit, and the cooling device preferably rotate about a shared rotational axis.

With regard to installation size and complexity, it is particularly advantageous when the laser unit and the receiving unit are jointly situated on a rotation element that rotates about the rotational axis.

In addition, it is particularly advantageous when the cooling device is likewise situated on the rotation element, resulting in further simplification of the design and a reduction in the space requirements.

It is regarded as particularly advantageous when the cooling device includes one or multiple vane elements, thus achieving an improvement in the cooling airflow and thus, improved cooling.

Another particularly advantageous exemplary embodiment of the present invention includes a control board on which the vane element is situated. In addition, it is also possible to situate the vane element at the laser unit and/or at the receiving unit and/or between rotating components. Optimal adaptation of the cooling airflow with regard to efficient cooling is possible due to these configuration options for one or multiple vane elements.

It is particularly advantageous when the cooling device of the LIDAR system includes a control board that is configured in such a way that the cooling airflow is generated by the control board itself. It is possible, for example, to situate the control board at an angle to a plane that is perpendicular to the rotational axis, or eccentrically with respect to the rotational axis, in order to generate the cooling airflow. For example, the control board may also be formed in such a way that a vane-like effect results due to the shape of the control board. In addition, for example components may be situated on or at the control board, likewise resulting in a vane-like effect, as the result of which the cooling airflow is generated. Since in this exemplary embodiment no additional vane elements or the like are necessary for the flow generation, this is particularly advantageous for ensuring a simple and cost-effective design.

Another particularly advantageous exemplary embodiment of the LIDAR system according to the present invention includes a heat exchanger for dissipating the heat that is absorbed by the cooling airflow. The heat exchanger may be designed in different ways. For example, a design as a passive heat exchanger in the form of cooling ribs or a metal foam is possible. In addition, an active heat exchanger, for example Peltier elements or heat exchangers including an exchange fluid or heat pipes, may be used. It is also possible to use multiple heat exchangers of the same or different type. Improved dissipation of the heat is achieved by the heat exchanger.

In addition, it is particularly advantageous when the LIDAR system is situated in a housing. The housing may preferably have a closed design in order to ensure protection of the components of the LIDAR system from moisture and other media.

In another particularly advantageous exemplary embodiment of the present invention, the heat exchanger is situated on a housing wall. A configuration of the housing with a working area and a cooling area is also possible. The cooling airflow flows from the working area, via an inlet area into the cooling area, and via an outlet area flows back into the working area. In such a configuration, the heat exchanger is situated in the cooling area. This results in particularly efficient cooling of the system.

It is particularly advantageous when the rotating cooling device is configured for generating a circular or a toroidal cooling airflow. A circular cooling airflow is characterized in that the airflow is led across the rotating components in the axial direction of the rotational axis, and is subsequently deflected in such a way that it is led back in the opposite axial direction of the rotational axis in an area parallel to the rotational axis and adjacent to the rotating components. The flow may be led through the cooling area, for example.

In the toroidal cooling airflow, the airflow is initially led across the rotating components in the axial direction of the rotational axis, and is subsequently deflected in such a way that the cooling airflow is led back in the opposite axial direction in an area situated concentrically with respect to the rotational axis and adjacent to the rotating components.

Such configurations of the cooling airflow allow efficient cooling of the rotating components, with a simple design.

Due to the targeted convection cooling with a defined flow control, an improved distribution of the heat over the rotating components is achieved, and severe temperature gradients that may result in malfunctions or functional restrictions of the LIDAR system are thus avoided.

Another advantageous exemplary embodiment of the present invention includes at least one stator element that is configured for generating turbulences of the cooling airflow and is stationarily mounted. A stationary mounting corresponds to a nonrotating mounting. An improvement in the flow control for further improved targeted convection cooling may be achieved by use of one or multiple stator elements. The stator elements are preferably situated on a housing.

In another particularly advantageous exemplary embodiment of the present invention, the heat exchanger is situated rotatingly about the rotational axis. For example, the heat exchanger may be situated on the rotation element. It is particularly advantageous to situate the heat exchanger close to the laser unit to allow direct, efficient dissipation of the heat generated by the laser unit.

BRIEF DESCRIPTION OF THE DRAWINGS

The present invention is described below with reference to exemplary embodiments in conjunction with the figures. Functionally equivalent components are denoted in each case by the same reference numerals in the figures.

FIG. 3 shows a LIDAR system according to a second exemplary embodiment, including a housing with a cooling area with circular cooling airflow, and multiple vane elements and stator elements situated at various positions.

FIG. 4 shows a LIDAR system according to a third exemplary embodiment, including a housing and with toroidal cooling airflow that is generated by vane elements of the cooling device.

DETAILED DESCRIPTION OF EXAMPLE EMBODIMENTS

Figure 1:
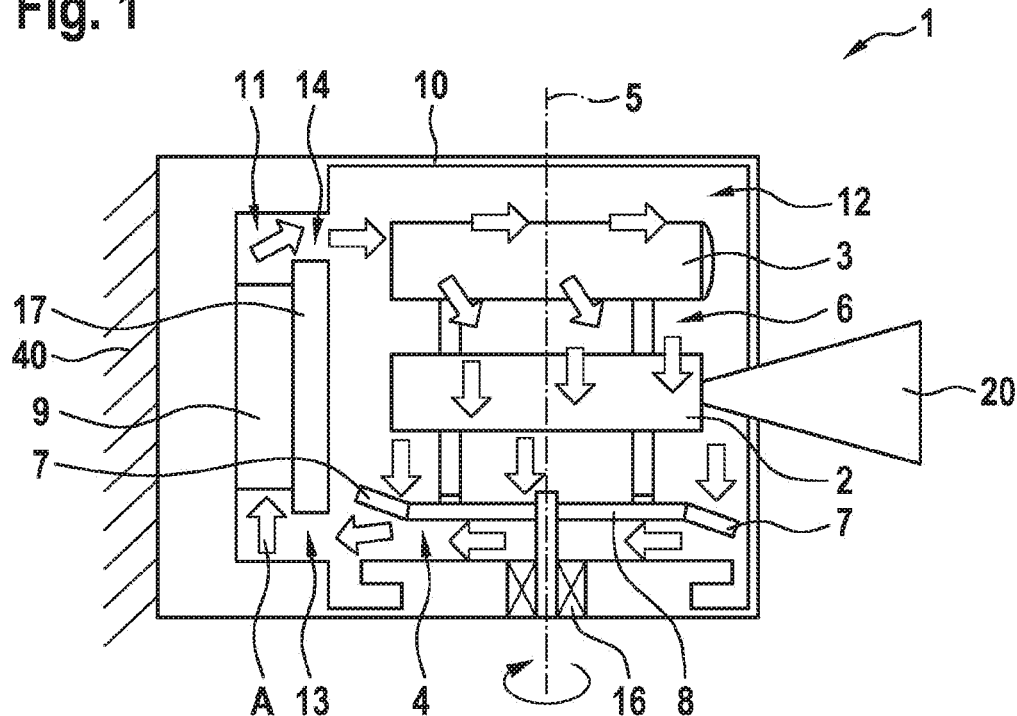
FIG. 1 shows a LIDAR system according to a first exemplary embodiment, including a housing with a cooling area and with circular cooling airflow that is generated by vane elements of the cooling device.
Figure 2:
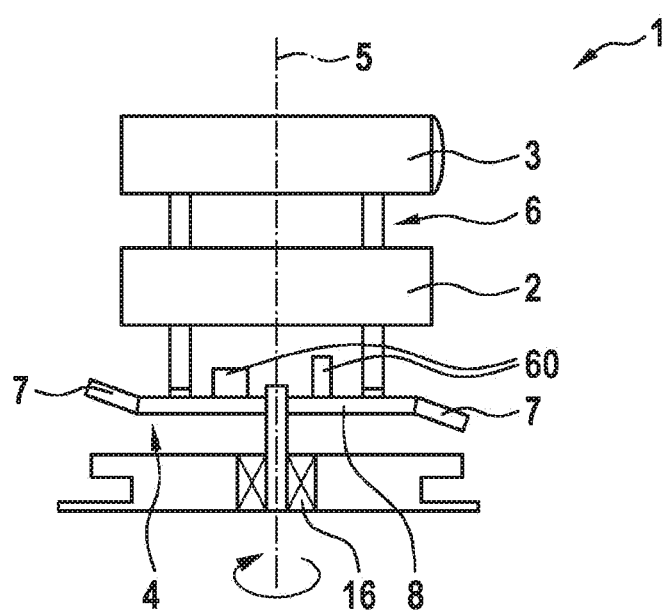
FIG. 2 shows a detail of the LIDAR system from FIG. 1, including vane elements that are situated at a control board.

FIGS. 1 and 2 show a LIDAR system 1 according to a first exemplary embodiment of the present invention. LIDAR system 1 illustrated in FIG. 1 includes a laser unit 2, a receiving unit 3, and a cooling device 4 that are jointly situated on a rotation element 6 and rotate about a shared rotational axis 5. In the first exemplary embodiment, cooling device 4 includes a control board 8 that is configured for controlling LIDAR system 1, and at which vane elements 7 are situated. A laser beam 20 for scanning the surroundings is emitted, for example, by laser unit 2 perpendicularly with respect to the rotational axis.

The first exemplary embodiment also includes a housing 10 with a working area 12, and a cooling area 11 in which a heat exchanger 9 is situated and which is in contact with working area 12 via an inlet area 13 and an outlet area 14 and separated from working area 12 by a wall 17. Housing 10 may be mounted at a vehicle 40, for example, at an outer side. Due to the rotation of rotation element 6, with the aid of cooling device 4 an airflow forms which flows across laser unit 2 and receiving unit 3 in the axial direction of rotational axis 5. This is illustrated by the arrows in FIG. 1.

FIG. 1 illustrates an exemplary embodiment with a circular cooling airflow A that flows across rotation element 6 in working area 12 in the axial direction of rotational axis 5, is subsequently deflected by 90 degrees with respect to the rotational axis, and flows across inlet area 13 from working area 12 into cooling area 11, where another deflection by 90 degrees takes place. When flow passes across the rotating components, in particular laser unit 2, which represents the hottest element, the temperature of these rotating components is reduced by forced convection. In cooling area 11, cooling airflow passes across and/or through heat exchanger 9, thus cooling the cooling airflow. Via outlet area 14, the colder cooling airflow is subsequently deflected by 90 degrees and is led back into working area 12. A reverse flow direction, opposite to the flow direction illustrated in FIG. 1, may also be used.

FIG. 2 shows a detail of the first exemplary embodiment of LIDAR system 1.

Rotation element 6 is designed, for example, as a framework which is configured for positioning and holding laser unit 2, receiving unit 3, and cooling device 4, and which via a bearing 16 is supported in housing 10 in such a way that a rotation about rotational axis 5 is made possible.

As is apparent in FIG. 2, laser unit 2, receiving unit 3, and cooling device 4 are preferably situated along an axial direction of rotational axis 5, laser unit 2 particularly preferably being situated between cooling device 4 and receiving unit 3.

Components 60 that are cooled may also be situated on control board 8, as illustrated in FIG. 2.

A second preferred exemplary embodiment with multiple stator elements 15 and multiple vane elements 7 is illustrated in FIG. 3, the further configuration of LIDAR system 1 corresponding to the first exemplary embodiment in FIG. 1.

Vane elements 7 and stator elements 15 are situated at various positions. In the second exemplary embodiment, vane elements 7 are situated at control board 8, at rotation element 6, and at receiving unit 3. Stator elements 15 are stationarily situated at housing 10. By use of multiple vane elements 7 and/or one or multiple stator elements 15, the cooling airflow may be better influenced, resulting in an improved distribution of the heat of the rotating components due to local adaptation of the flow.

FIG. 4 shows a third advantageous exemplary embodiment with a toroidal cooling airflow B. Housing 10 does not include a cooling area in this exemplary embodiment. For toroidal cooling airflow B, the cooling airflow is led across the rotating components in the axial direction of rotational axis 5. The flow may subsequently be led across a heat exchanger 9, for example, as in the exemplary embodiment illustrated in FIG. 4. The cooling airflow is subsequently deflected, and is led back in the opposite axial direction of rotational axis 5 in an area that is concentric with respect to rotational axis 5 and adjacent to the rotating components in the radial direction. Toroidal cooling airflow B may also be used with a reverse flow direction, opposite to the flow direction illustrated in FIG. 4.

Figure 5:
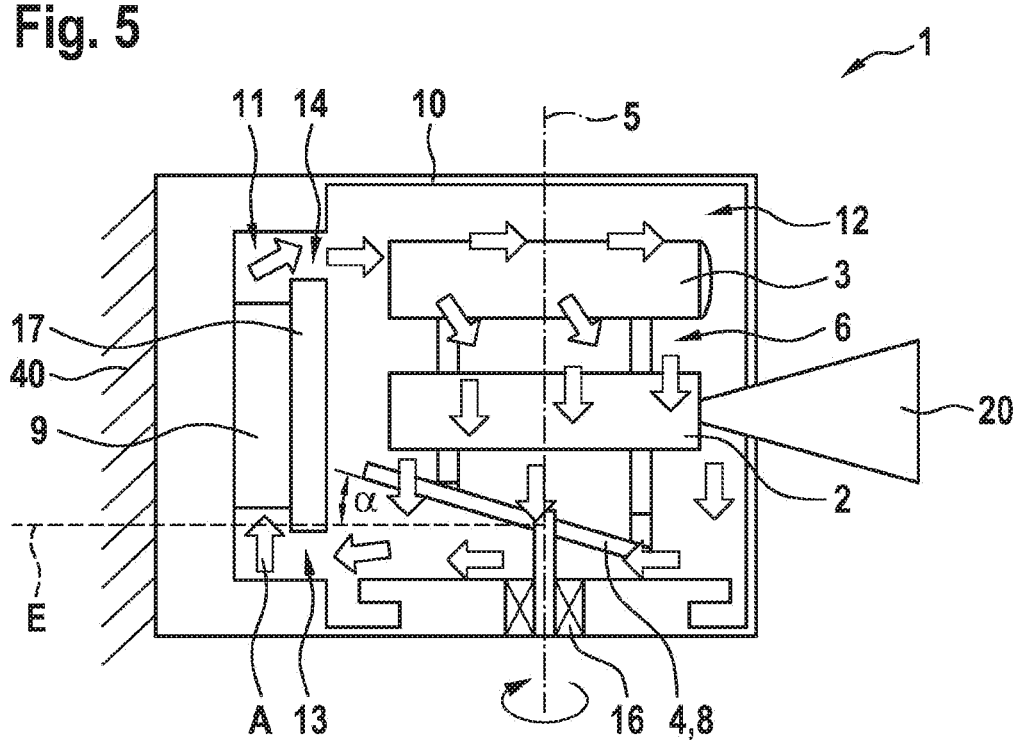
FIG. 5 shows a LIDAR system according to a fourth exemplary embodiment, including a housing with a cooling area with circular cooling airflow, and a control board that is configured for generating the cooling airflow.

FIG. 5 shows a fourth exemplary embodiment that includes a control board 8, and in which control board 8 is situated perpendicularly with respect to rotational axis 5 at an angle $\alpha$ relative to a plane E. Due to this arrangement of control board 8 by way of example, when control board 8 rotates about rotational axis 5 an airflow may be generated in a direction along rotational axis 5, as the result of which no vane elements are necessary for generating the airflow. In the fourth exemplary embodiment, the cooling airflow is designed as circular cooling airflow A and housing 10 is designed with a cooling area 11, analogously to the exemplary embodiment in FIG. 1.

In addition, in all described exemplary embodiments control board 8 may be situated at the rotation element, and for example may include components 60 that are cooled.

In all exemplary embodiments, for example mounting of LIDAR system 1 at an outer side of the housing that is situated in parallel to rotational axis 5 is possible, as illustrated in the first exemplary embodiment in FIG. 1.

In addition, in all exemplary embodiments, mounting at an outer side perpendicular to the rotational axis is possible, as shown in the third exemplary embodiment in FIG. 4.

What is claimed is:

1. A LIDAR system, comprising:
   a laser unit;
   a receiving unit;
   a cooling device configured to generate a cooling airflow, wherein the cooling device includes a plurality of vane elements;
   a housing, in which the laser unit, the receiving unit, and the cooling device are situated, wherein each of the laser unit, the receiving unit and the cooling device rotate; and
   a control board, wherein the vane elements are situated at the control board, and/or the laser unit, and/or the receiving unit;
   wherein the cooling device is configured for generating a circular cooling airflow or a toroidal cooling airflow,
   wherein the laser unit, the receiving unit, and the cooling device are situated rotatingly about a rotational axis,
   wherein the laser unit and the receiving unit are jointly situated on a rotation element,
   wherein the rotation element is configured for positioning and holding the laser unit, the receiving unit, and the cooling device, and which via a bearing is supported in the housing so that rotation is provided about a rotational axis, and
   wherein the laser unit, the receiving unit, and the cooling device are situated along an axial direction of the rotational axis.

2. The LIDAR system as recited in claim 1, wherein the laser unit is situated between the cooling device and the receiving unit.

3. The LIDAR system as recited in claim 1, wherein the cooling device also includes a control board that is configured for generating the cooling airflow.

4. The LIDAR system as recited in claim 1, further comprising:
   a heat exchanger configured to dissipate heat that is absorbed by the cooling airflow.

5. The LIDAR system as recited in claim 4, further comprising:
   a housing in which the rotating laser unit, the rotating receiving unit, and the rotating cooling device are situated.

6. The LIDAR system as recited in claim 5, wherein the heat exchanger is situated at a housing wall, or the housing includes a working area and a cooling area, the heat exchanger being situated in the cooling area.

7. The LIDAR system as recited in claim 4, wherein the heat exchanger is situated rotatingly about the rotational axis.

8. The LIDAR system as recited in claim 1, further comprising:
   at least one stator element that is stationarily situated to generate turbulences of the cooling airflow.

\* \* \* \* \*